United States Patent
Lee et al.

(10) Patent No.: US 9,997,482 B2
(45) Date of Patent: Jun. 12, 2018

(54) SOLDER STUD STRUCTURE

(71) Applicant: Taiwan Semiconductor Manufacturing Co., Ltd, Hsin-Chu (TW)

(72) Inventors: Li-Guo Lee, Taipei (TW); Yi-Chen Liu, Zhubei (TW); Yung-Sheng Liu, Hsinchu (TW); Yi-Jen Lai, Hsinchu (TW); Chun-Jen Chen, Jhubei (TW); Hsi-Kuei Cheng, Zhubei (TW)

(73) Assignee: TAIWAN SEMICONDUCTOR MANUFACTURING CO., LTD., Hsin-Chu (TW)

(*) Notice: Subject to any disclaimer, the term of this patent is extended or adjusted under 35 U.S.C. 154(b) by 0 days. days.

(21) Appl. No.: 14/208,675

(22) Filed: Mar. 13, 2014

(65) Prior Publication Data

US 2015/0262954 A1 Sep. 17, 2015

(51) Int. Cl.
*H01L 23/52* (2006.01)
*H01L 23/00* (2006.01)

(52) U.S. Cl.
CPC .............. *H01L 24/13* (2013.01); *H01L 24/05* (2013.01); *H01L 24/03* (2013.01); *H01L 24/11* (2013.01); *H01L 24/81* (2013.01); *H01L 2224/0345* (2013.01); *H01L 2224/0347* (2013.01); *H01L 2224/03452* (2013.01); *H01L 2224/0401* (2013.01); *H01L 2224/05008* (2013.01); *H01L 2224/0558* (2013.01); *H01L 2224/05124* (2013.01); *H01L 2224/05139* (2013.01); *H01L 2224/05147* (2013.01); *H01L 2224/05184* (2013.01); *H01L 2224/05573* (2013.01); *H01L 2224/05647* (2013.01); *H01L 2224/05655* (2013.01); *H01L 2224/05666* (2013.01); *H01L 2224/11462* (2013.01); *H01L 2224/11472* (2013.01); *H01L 2224/13017* (2013.01); *H01L 2224/13139* (2013.01); *H01L 2224/16058* (2013.01); *H01L 2224/16227* (2013.01); *H01L 2224/73204* (2013.01); *H01L 2224/8183* (2013.01); *H01L 2224/81193* (2013.01); *H01L 2224/81203* (2013.01); *H01L 2924/13091* (2013.01)

(58) Field of Classification Search
CPC ..... H01L 24/10; H01L 24/81; H01L 25/0657; H01L 2224/13611; H01L 2224/32147
USPC .......................... 257/737, 738, 777, 780, 781
See application file for complete search history.

(56) References Cited

U.S. PATENT DOCUMENTS

| | | | |
|---|---|---|---|
| 8,633,598 B1* | 1/2014 | St. Amand | H01L 23/3135 257/778 |
| 2010/0314745 A1* | 12/2010 | Masumoto | H01L 23/49811 257/692 |
| 2012/0025365 A1* | 2/2012 | Haba | H01L 21/4853 257/692 |
| 2012/0049346 A1* | 3/2012 | Lin et al. | 257/737 |
| 2012/0068334 A1* | 3/2012 | Migita | H01L 24/11 257/737 |

(Continued)

*Primary Examiner* — Matthew E Warren
(74) *Attorney, Agent, or Firm* — McClure, Qualey & Rodack, LLP

(57) ABSTRACT

A semiconductor structure is provided. The semiconductor structure includes a first substrate and a metal pad formed over the first substrate. The semiconductor structure further includes a solder stud formed over the metal pad, and the solder stud has a flat top surface parallel to a top surface of the first substrate.

20 Claims, 7 Drawing Sheets

(56) References Cited

U.S. PATENT DOCUMENTS

| | | | |
|---|---|---|---|
| 2012/0138337 A1* | 6/2012 | Kim | 174/250 |
| 2013/0020709 A1* | 1/2013 | Huang | H01L 24/16 257/762 |
| 2014/0048929 A1* | 2/2014 | Cha | H01L 21/76897 257/737 |
| 2014/0131855 A1* | 5/2014 | Sylvestre | H01L 24/81 257/737 |

* cited by examiner

SOLDER STUD STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers over a semiconductor substrate, and patterning the various material layers using lithography to form circuit components and elements thereon.

One important driver for increasing performance of a semiconductor device is the higher levels of integration of circuits. This is accomplished by miniaturizing or shrinking device sizes on a given chip. Modern integrated circuits are made up of a great amount of active devices such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads may be formed and exposed on the surface of the respective chip. Electrical connections are made through bond pads to connect the chip to a package substrate or another die.

However, although existing bond pads have been generally adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
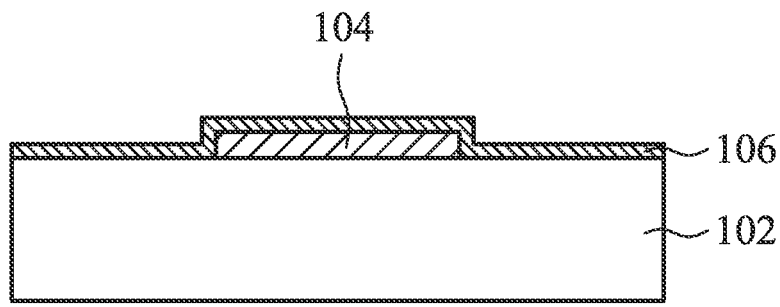
FIGS. 1A to 1E are cross-sectional representations of various stages of forming a semiconductor structure having a solder stud in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments for forming a semiconductor structure are provided in accordance with some embodiments of the disclosure. The semiconductor structure may include a solder stud in accordance with some embodiments. A reflow process is not required during the formation of the solder stud, and therefore the shape of the solder stud can be controlled according to the applications.

FIGS. 1A to 1E are cross-sectional representations of various stages of forming a semiconductor structure having a solder stud 114a in accordance with some embodiments. Referring to FIG. 1A, a substrate 102 is provided in accordance with some embodiments. Substrate 102 may be a semiconductor chip. Substrate 102 may include one of a variety of types of semiconductor substrates employed in semiconductor integrated circuit fabrication, and integrated circuits may be formed in and/or upon substrate 102. Substrate 102 may be a silicon substrate. Alternatively or additionally, substrate 102 may include elementary semiconductor materials, compound semiconductor materials, and/or alloy semiconductor materials. The elementary semiconductor materials may include, but are not limited to, crystal silicon, polycrystalline silicon, amorphous silicon, germanium, and/or diamond. The compound semiconductor materials may include, but are not limited to, silicon carbide, gallium arsenic, gallium phosphide, indium phosphide, indium arsenide, and/or indium antimonide. The alloy semiconductor materials may include, but are not limited to, SiGe, GaAsP, AlInAs, AlGaAs, GaInAs, GaInP, and/or GaInAsP.

In addition, substrate 102 may further include a plurality of isolation features, such as shallow trench isolation (STI) features or local oxidation of silicon (LOCOS) features. The isolation features isolate various microelectronic elements formed in and/or upon substrate 102. The types of microelectronic elements formed in substrate 102 may include, but are not limited to, transistors such as metal oxide semiconductor field effect transistors (MOSFETs), complementary metal oxide semiconductor (CMOS) transistors, bipolar junction transistors (BJTs), high voltage transistors, high frequency transistors, p-channel and/or n-channel field effect transistors (PFETs/NFETs), resistors, diodes, capacitors, inductors, fuses, and/or other applicable elements.

Various processes may be performed to form the various microelectronic elements, including but not limited to one or more of deposition, etching, implantation, photolithography, annealing, and other applicable processes. The microelectronic elements may be interconnected to form the integrated circuit device, including logic devices, memory devices (e.g., SRAM), radio frequency (RF) devices, input/output (I/O) devices, system-on-chip (SoC) devices, or other applicable devices.

Furthermore, substrate 102 may further include an interconnection structure overlying the integrated circuits. The interconnection structure may include inter-layer dielectric layers and a metallization structure overlying the integrated circuits. The inter-layer dielectric layers in the metallization structure may include low-k dielectric materials, un-doped silicate glass (USG), silicon nitride (SiN), silicon oxynitride (SiON), or other commonly used materials. Metal lines in the metallization structure may be made of copper, copper alloys, or other applicable conductive material.

A metal pad 104 is formed over substrate 102, as shown in FIG. 1A in accordance with some embodiments. In some embodiments, metal pad 104 is made of conductive materials such as aluminum (Al), copper (Cu), tungsten (W), AlCu alloys, silver (Ag), or other applicable conductive materials. Metal pad 104 may be formed by chemical vapor deposition (CVD), physical vapor deposition (PVD), or other applicable techniques. In addition, metal pad 104 may be a portion of conductive routes in substrate 102 and may be configured to provide an electrical connection upon which a bump structure may be formed for facilitating external electrical connections. It should be noted that additional material layers may also be formed over metal pad 104 although they are not shown in FIG. 1A.

Next, a seed layer 106 is formed over substrate 102 to cover metal pad 104, as shown in FIG. 1A in accordance with some embodiments. In some embodiments, seed layer 106 is made of conductive materials such as TiW, TiCu, Cu, CuAl, CuCr, CuAg, CuNi, CuSn, CuAu, or the like. Seed layer 106 may be formed of PVD, sputtering, or other applicable techniques.

Figure 1B:
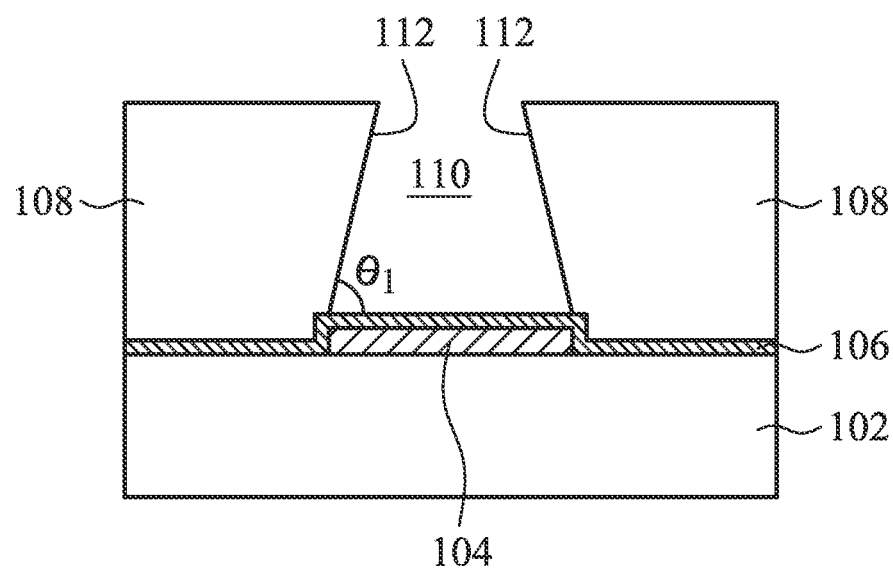

Afterwards, a photoresist layer 108 is formed over seed layer 106, as shown in FIG. 1B in accordance with some embodiments. Photoresist layer 108 includes an opening 110 over metal pad 104, such that a portion of seed layer 106 over metal pad 104 is exposed by opening 110. In some embodiments, opening 110 in photoresist layer 108 is formed by an exposure process and a developing process.

As shown in FIG. 1B, opening 110 is in a shape of a tetragon having straight sidewalls 112 in accordance with some embodiments. In some embodiments, a bottom angle $\theta_1$ of opening 110 is in a range from about 45° to about 90°. In some embodiments, bottom angle $\theta_1$ of opening 110 is in a range from about 45° to about 85°, such that opening 110 is in the shape of a trapezoid.

Figure 1C:
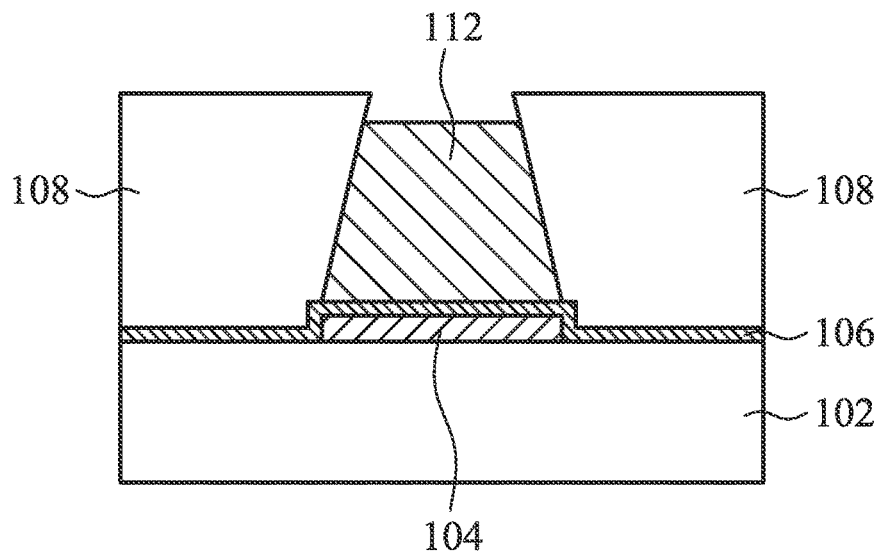

After opening 110 is formed, a solder material 112 is formed to fill in opening 110, as shown in FIG. 1C in accordance with some embodiments. In some embodiments, the solder material includes tin (Sn), silver (Ag), or a combination thereof. In some embodiments, solder material 112 is a conductive material including tin. In some embodiments, the solder material is a lead-free material. Solder material 112 may be formed by electroplating, chemical plating, or other applicable processes.

Figure 1D:
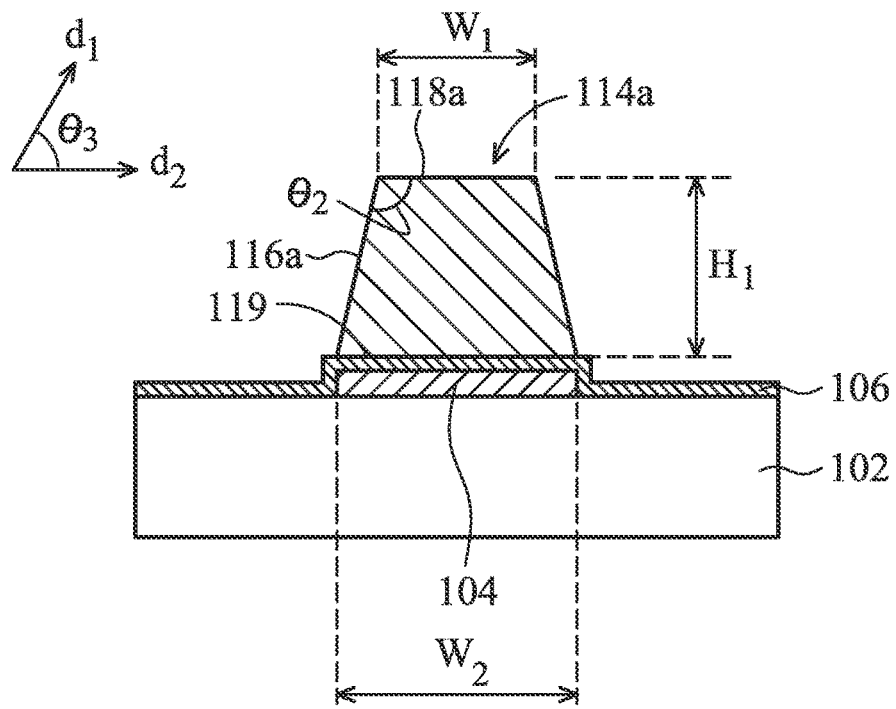

Next, photoresist layer 108 is removed to form solder stud 114a, as shown in FIG. 1D in accordance with some embodiments. The shape of solder stud 114a may be the same as, or similar to, that of opening 110. In addition, since solder stud 114a is formed without using a reflow process, the shape of solder stud 114a can be precisely controlled.

In some embodiments, solder stud 114a is in the shape of a tetragon having a straight sidewall 116a and a flat top surface 118a. In addition, flat top surface 118a is parallel to a top surface of substrate 102 in accordance with some embodiments. In some embodiments, solder stud 114a has a height $H_1$ in a range from about 5 μm to about 20 μm. Since solder stud 114a does not need to be reflowed before bonding with another structure, height $H_1$ of solder stud 114a can be relatively high, such that the formation of a conductive post is not required below solder stud 114a to provide sufficient height for bonding.

In some embodiments, flat top surface 118a of solder stud 114a has a first width $W_1$ in a range from about 10 μm to about 50 μm. In some embodiments, a bottom surface 119 of solder stud 114a has a second width $W_2$ in a range from about 10 μm to about 50 μm. In some embodiments, a ratio of first width $W_1$ to second width $W_2$ is in a range from about 0.2 to about 1. As described previously, since the formation of solder stud 114a does not include a reflow process, the shape of solder stud 114a can be controlled as required. For example, when second width $W_2$ is too narrow, the stress on solder stud may be too great. On the other hand, when second width $W_2$ is too great, the solder stud may not be applicable to a fine pitch flip chip.

In some embodiments, an angle $\theta_2$ between straight sidewall 116a and flat top surface 118a is in a range from about 90° to about 135°. In some embodiments, straight sidewall 116a of solder stud 114a is in a first direction $d_1$, and substrate 102 is in a second direction $d_2$, and an angle $\theta_3$ between first direction $d_1$ and second direction $d_2$ is in a range from about 45° to about 90°.

As shown in FIG. 1D, solder stud 114a is in a shape of a trapezoid in accordance with some embodiments. When solder stud 114a is in the shape of a trapezoid, the bottom surface of solder stud 114a is relatively large and therefore it become easier to release the stress on solder stud 114a to substrate 102.

In some embodiments, an angle $\theta_2$ between straight sidewall 116a and flat top surface 118a is in a range from about 95° to about 135°. In some embodiments, angle $\theta_3$ between first direction $d_1$ and second direction $d_2$ is in a range from about 45° to about 85°.

Figure 1E:
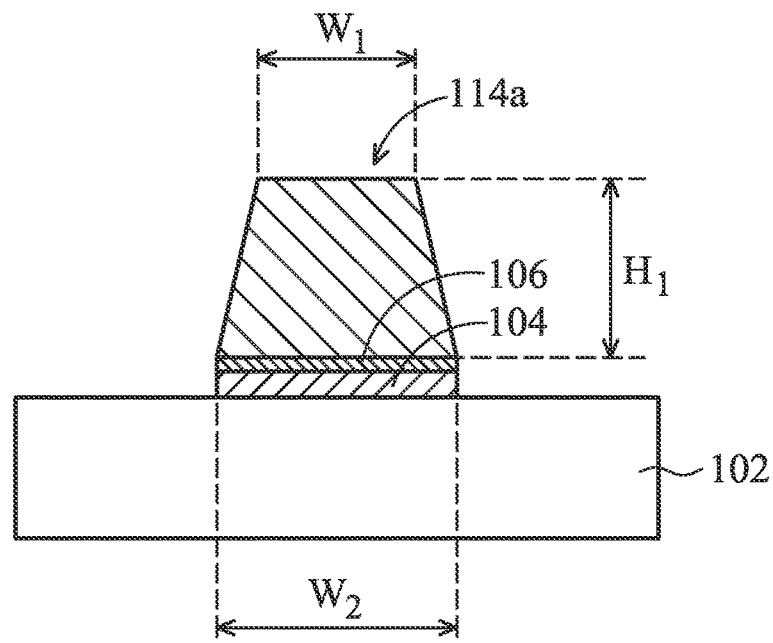

Next, the portion of seed layer 106 which is not covered by solder stud 114a is removed, as shown in FIG. 1E in accordance with some embodiments. The portion of seed layer 106 may be removed by an etching process, such as a wet etching process.

Solder stud 114a formed on substrate 102 may be used to bond with a conductive post formed over another substrate by heat-press-bonding. Therefore, no reflow process is required, and the shape of solder stud 114a can be controlled.

Figure 2:
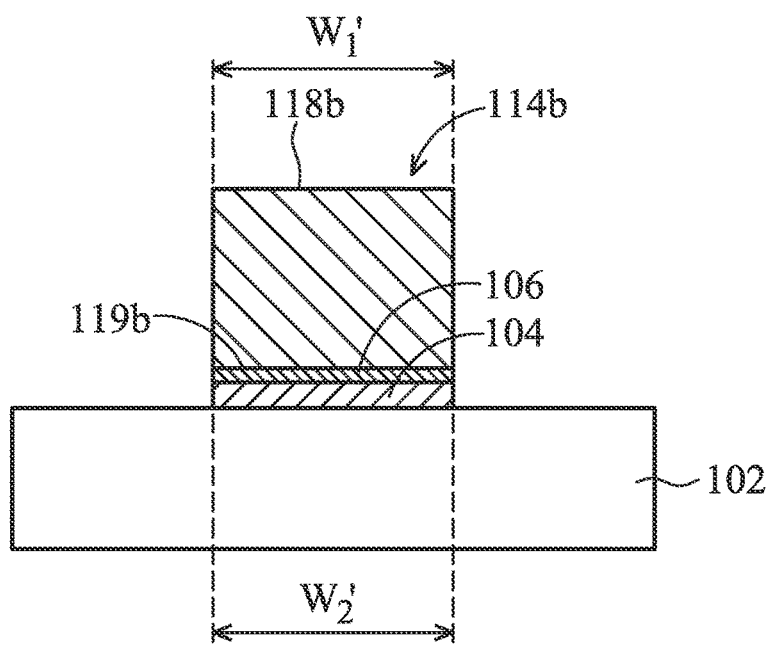
FIG. 2 is a cross-sectional representation of a semiconductor structure having a solder stud in accordance with some embodiments.

FIG. 2 is a cross-sectional representation of a semiconductor structure having a solder stud 114b in accordance with some embodiments. Formation and materials for forming solder stud 114b are similar to those for forming solder stud 114a, except solder stud 114b has a rectangular shape.

As shown in FIG. 2, seed layer 106 is formed on metal pad 104, and solder stud 114b is formed on seed layer 106 over substrate 102 in accordance with some embodiments. In addition, solder stud 114b is in the shape of a rectangle, and an bottom angle of solder stud 114b is about 90°. Since solder stud 114b is in the shape of a rectangle, the formation of solder stud 114b becomes easier while height $H_1$ of solder stud 114b can still be controlled.

In some embodiments, a top surface 118b of solder stud 114b has a first width $W_1'$ and a bottom surface 119b of solder stud 114b has a second width $W_2'$. First width $W_1'$ may be substantially equal to second width $W_2'$.

Figure 3A:
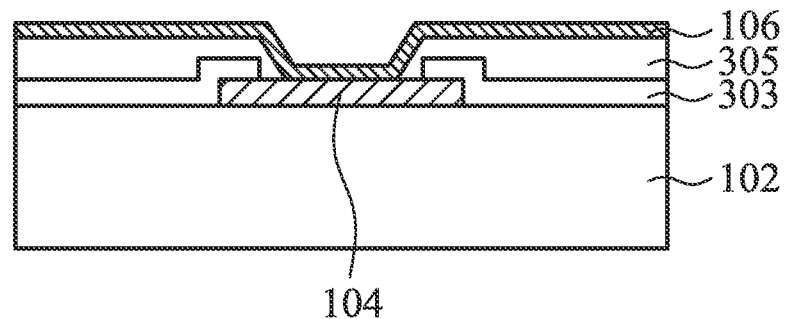
FIGS. 3A to 3F are cross-sectional representations of various stages of forming a semiconductor structure having a solder stud in accordance with some embodiments.

FIGS. 3A to 3F are cross-sectional representations of various stages of forming a semiconductor structure having a solder stud 114c in accordance with some embodiments. Referring to FIG. 3A, metal pad 104 is formed over substrate 102, as shown in FIG. 3A in accordance with some embodiments. A passivation layer 303 is formed and patterned over substrate 102 in accordance with some embodiments. As shown in FIG. 3A, passivation layer 303 has an opening to expose a portion of metal pad 104. Passivation layer 303 may be made of dielectric materials, such as silicon nitride, silicon oxynitride, silicon oxide, or un-doped silicate glass (USG). Passivation layer 303 may be formed by chemical vapor deposition (CVD), physical vapor deposition (PVD), atomic layer deposition (ALD), high density plasma CVD (HDPCVD), metal organic CVD (MOCVD), plasma enhanced CVD (PECVD), or a thermal process such as furnace deposition.

Furthermore, a polymer layer 305 is further formed over passivation layer 303 in accordance with some embodiments. As shown in FIG. 3A, polymer layer 305 also has an opening to expose a portion of metal pad 104. Polymer layer 305 may be made of materials such as polyimide, epoxy, benzocyclobutene (BCB), polybenzoxazole (PBO), or the like, although other relatively soft, often organic, dielectric materials may also be used. Polymer layer 305 may be formed by CVD, PVD, or other applicable techniques.

Figure 3B:
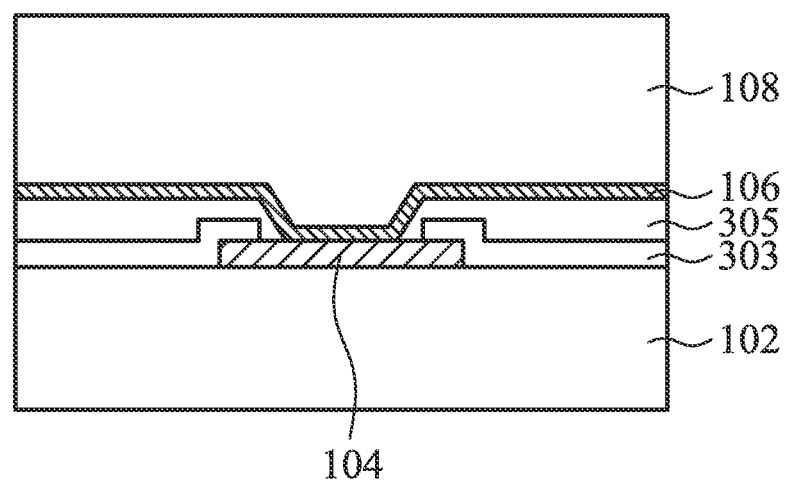
Figure 3C:
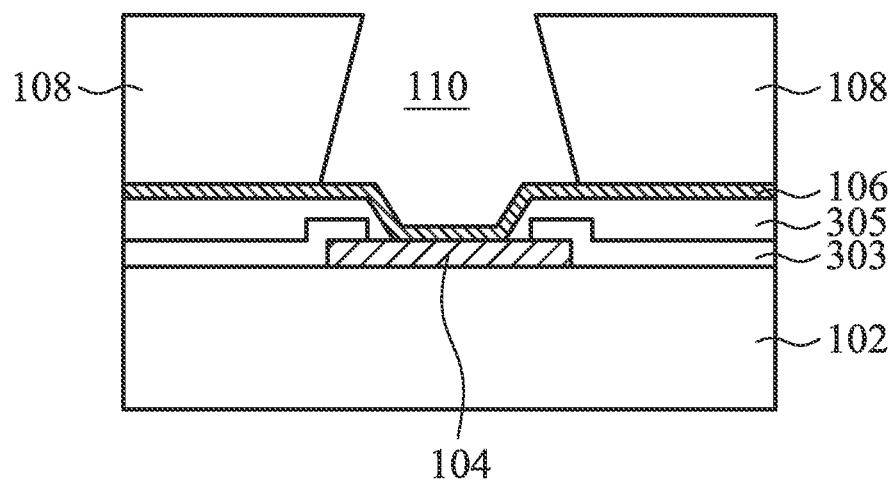

After passivation layer 303 and polymer layer 305 are formed, seed layer 106 is formed over substrate 102 to cover polymer layer 305 and the portion of metal pad 104 exposed by polymer layer 305, as shown in FIG. 3A in accordance with some embodiments. Afterwards, a photoresist layer 108 is formed over seed layer 106, as shown in FIG. 3B in accordance with some embodiments. Opening 110 is formed over metal pad 104, such that a portion of seed layer 106 over metal pad 104 is exposed by opening 110, as shown in FIG. 3C in accordance with some embodiments. In some embodiments, opening 110 in photoresist layer 108 is formed by an exposure process and a develop process.

As shown in FIG. 3C, opening 110 is in a shape of tetragon having straight sidewalls 112 in accordance with some embodiments. Therefore, solder stud 114c formed in opening 110 in the sequential processes will also have straight sidewalls.

Figure 3D:
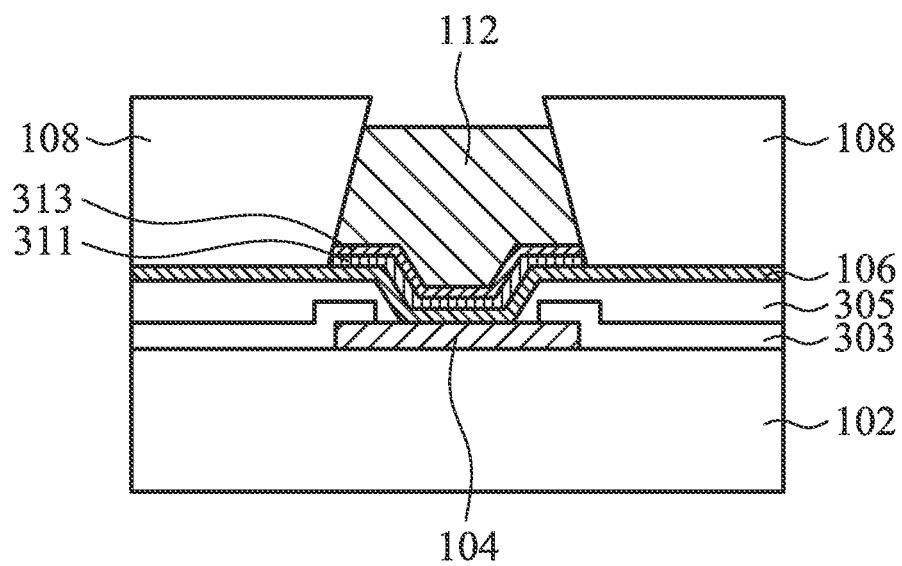

Next, a first metal layer 311 is formed in opening 110 and a second metal layer 313 is formed over first metal layer 311, as shown in FIG. 3D in accordance with some embodiments. In some embodiments, first metal layer 311 is a copper layer, although other metallic materials may also be used to formed first metal layer 311 in some other embodiments. In some embodiments, second metal layer 313 is a nickel layer, although other metallic materials may also be used to form second metal layer 313 in some other embodiments.

It should be noted that first metal layer 311 and second metal layer 313 are merely examples for better understanding the disclosure but first metal layer 311 and second metal layer 313 are not necessarily required. For example, seed layer 106 may be directly formed over metal layer 104 without forming first metal layer 311 and second metal layer 313, as shown in FIG. 1A. In some other examples, only one metal layer is formed over metal pad 104. In yet other examples, more than two metal layers are formed over metal pad 104.

Figure 3E:
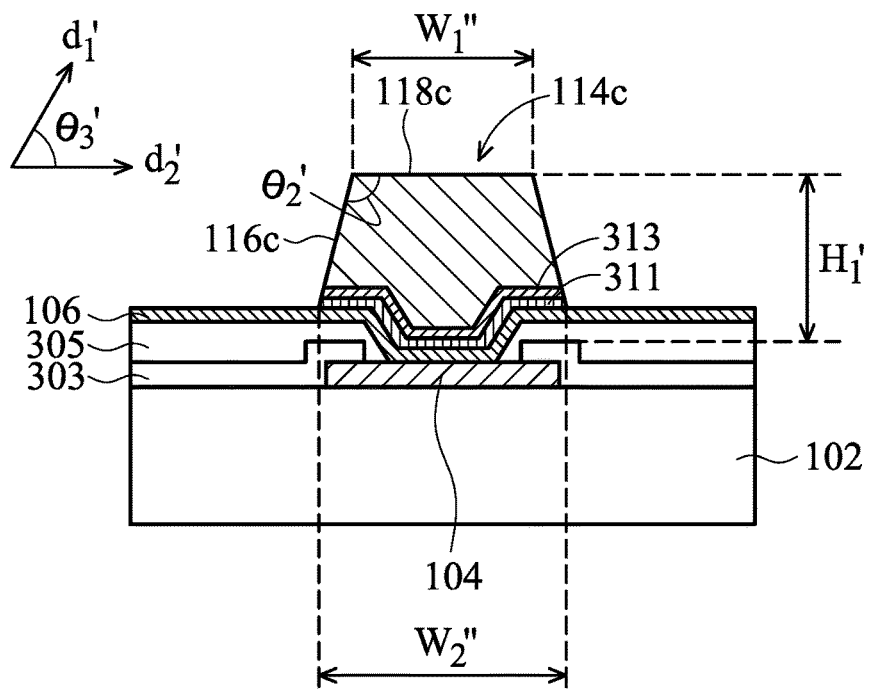

Afterwards, solder material 112 is formed in opening 110 over second metal layer 313, as shown in FIG. 3D in accordance with some embodiments. Next, photoresist layer 108 is removed to form solder stud 114c, as shown in FIG. 3E in accordance with some embodiments. Since solder stud 114c, second metal layer 313, first metal layer 311, and metal pad 104 are all made of conductive materials, they are all electrically connected in accordance with some embodiments.

As shown in FIG. 3E, solder stud 114c has a straight sidewall 116c and a flat top surface 118c, as shown in FIG. 3E in accordance with some embodiments. In some embodiments, solder stud 114c is in a shape of a tetragon having a straight sidewall 116c and a flat top surface 118c. In some embodiments, flat top surface 118c is parallel to the top surface of substrate 102.

In some embodiments, flat top surface 118c of solder stud 114c has a first width $W_1''$ similar to first width $W_1$ shown in FIG. 1D, and a bottom portion of solder stud 114c has a second width $W_2''$ similar to second width $W_2$. In some embodiments, an angle $\theta_2'$ between straight sidewall 116c and flat top surface 118c is in a range from about 90° to about 135°, or in a range from about 95° to about 135°. In addition, straight sidewall 116c of solder stud 114c is in a first direction $d_1'$, and substrate 102 is in a second direction $d_2'$, and an angle $\theta_3'$ between first direction $d_1'$ and second direction $d_2'$ is in a range from about 45° to about 90°, or in a range from about 45° to about 85°.

In addition, solder stud 114c has a height $H_1'$ similar to height $H_1$. As described above, height $H_1'$ of solder stud 114c can be precisely controlled and adjusted as required, and therefore a conductive post having a relatively great height is not required. As shown in FIG. 3E, although first metal layer 311 and second metal layer 313 are formed below solder stud 114c, first metal layer 311 and second metal layer 313 may each have a relatively small thickness. In some embodiments, a sum of the thickness of first metal layer 311 and a thickness of second metal layer 313 is less than height $H_1'$ of solder stud 114c.

Figure 3F:
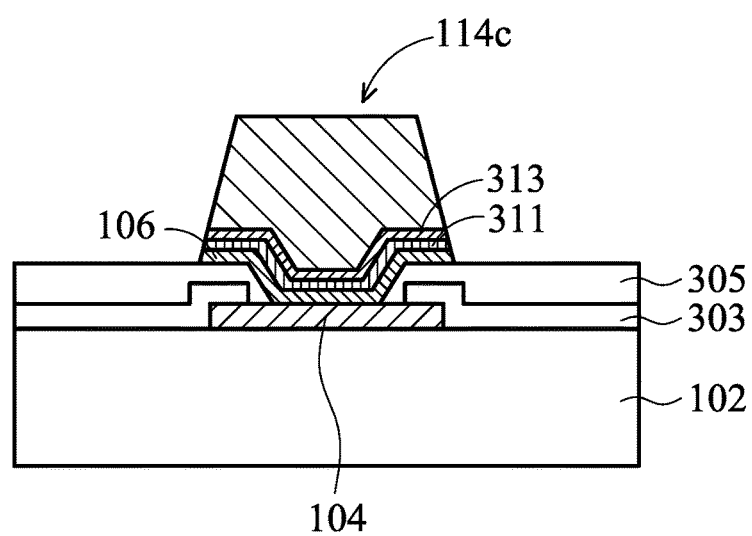

Next, the portion of seed layer 106 which is not covered by solder stud 114c is removed, as shown in FIG. 3F in accordance with some embodiments. The portion of seed layer 106 may be removed by an etching process, such as a wet etching process.

Figure 4:
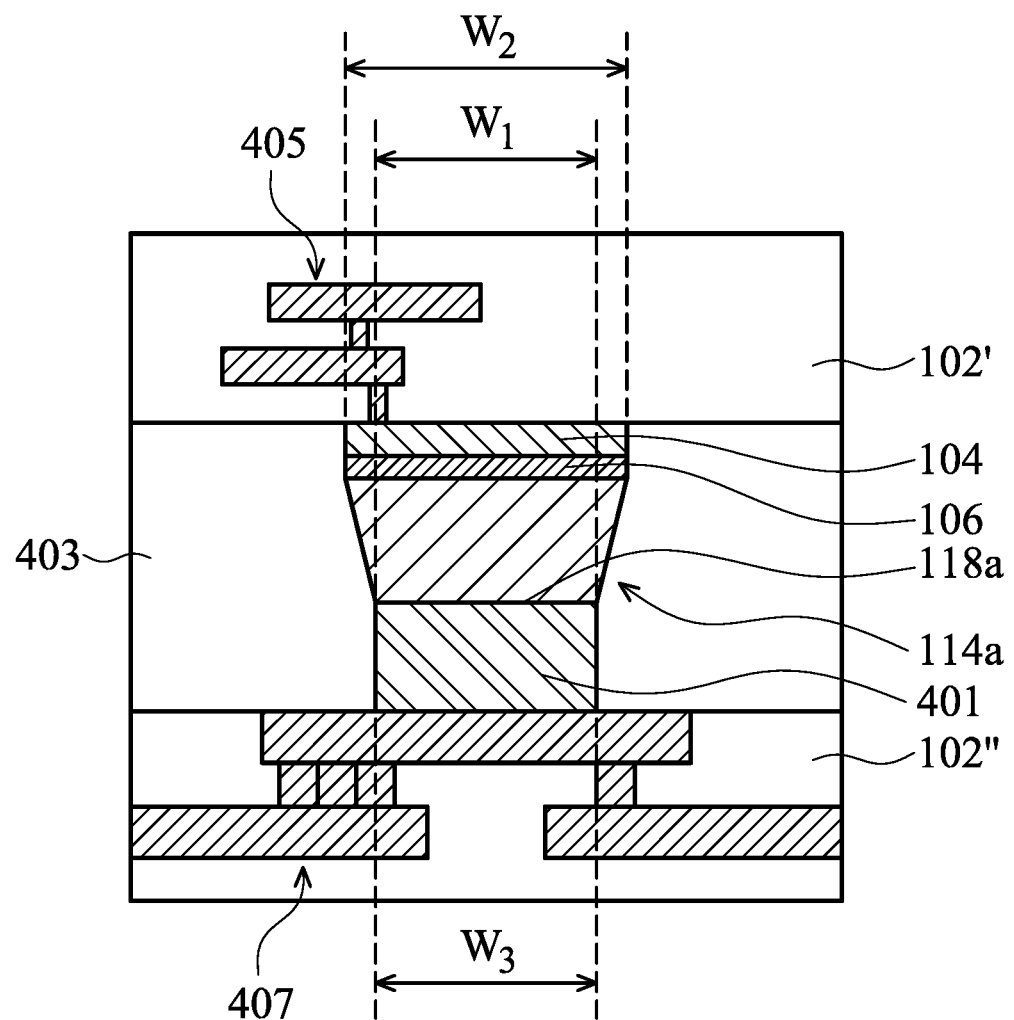
FIG. 4 is a cross-sectional representation of a semiconductor structure including a solder stud in accordance with some embodiments.

A solder studs, such as solder studs 114a, 114b, and 114c, have the shape of a stud instead of a ball and can be used to bond with a conductive post formed over another substrate. That is, two substrates can be bonded by the solder studs described above. FIG. 4 is a cross-sectional representation of a semiconductor structure including solder stud 114a shown in FIG. 1E in accordance with some embodiments. However, it should be noted that solder stud 114a shown in FIG. 4 is merely an example, and solder studs having other shapes or structures, such as solder studs 114b and 114c, may alternatively or additionally be used in a semiconductor structure, and the scope of the disclosure is not intended to be limiting.

As shown in FIG. 4, solder stud 114a formed on a first substrate 102' is bonded with a conductive post 401 formed over a second substrate 102'' in accordance with some embodiments. In some embodiments, solder stud 114a and conductive post 401 are bonded by heat-press-bonding, and therefore, no reflow process is required. In some embodiments, non-conductive paste (NCP) 403 is formed over second substrate 102'', and solder stud 114a is bonded to conductive post 401 afterwards. As shown in FIG. 4, gaps between first substrate 102' and second substrate 102'' are filled with NCP 403.

As shown in FIG. 4, top surface 118a of solder stud 114a has first width $W_1$, and conductive post 401 has a third width $W_3$. In some embodiments, third width $W_3$ is in a range from about 10 μm to about 50 μm. In some embodiments, a ratio of third width $W_2$ to first width $W_1$ is in a range from about 0.3 to about 1.

In some embodiments, first substrate 102' is a semiconductor chip including conductive features 405 formed therein. Conductive features 405 may be electrically connected to metal pad 104. In some embodiments, second substrate 102" includes conductive features 407, and conductive features 407 are electrically connected to conductive post 401. In some embodiments, conductive post 401 is a copper pillar.

Since the solder studs, such as solder studs 114a, 114b, and 114c, have a stud shape instead of a ball shape, the solder studs can be applied to more and various devices, compared to solder balls. More specifically, when solder balls are formed and bonded to another structure, reflow processes are required. However, during the reflow processes, risks of bump bridging, which means that one bump structure (e.g. the solder ball) is in contact with the adjacent bump structure (e.g. the other solder ball), increase. Therefore, a pitch between two adjacent solder balls should be relatively large or the structure may be short. Accordingly, the applications of solder balls are limited.

On the other hand, the formation and bonding of the solder studs, including solder studs 114a, 114b, and 114c, does not require the reflow process. Therefore, the size and shape of the solder studs can be controlled as designed. For example, solder stud 114a has a relatively large height $H_1$, and therefore a conductive pillar does not need to be formed below solder stud 114a to provide the desired height, as shown in FIG. 1E. Accordingly, processes and costs for forming solder stud 114 are reduced.

In addition, the solder studs are formed without using the reflow process, and the width of the solder studs can be precisely controlled. Therefore, the ricks of bump bridging are reduced. Accordingly, the solder studs may be used to form a fine pitch flip chip, which has a pitch less than 100 μm, for example. In some embodiments, the solder studs are applied on a bump-on-trace (BOT) structure.

Furthermore, the solder studs, such as solder stud 114a, may be in the shape of a trapezoid in accordance with some embodiments. That is, bottom surface 119a of solder stud 114a has second width $W_2$ greater than first width $W_1$ of top surface 118a. Therefore, stress on solder stud 114a can be easier to release to substrate 102 through bottom surface 119a.

Embodiments for forming a semiconductor structure having a solder stud are provided. The formation of the solder stud does not require using a reflow process, and therefore the size and the shape of the solder stud can be controlled depending on its applications. For example, the solder stud may have a flat top surface and a straight sidewall, or the solder stud may have the shape of a trapezoid. Therefore, the applications of the solder stud are broadened. In addition, the solder stud has a relatively great height, and formation of a conductive pillar may not be needed. Therefore, processes and costs for forming the solder stud are reduced.

In some embodiments, a semiconductor structure is provided. The semiconductor structure includes a first substrate and a metal pad formed over the first substrate. The semiconductor structure further includes a solder stud formed over the metal pad, and the solder stud has a straight sidewall.

In some embodiments, a semiconductor structure is provided. The semiconductor structure includes a first substrate and a metal pad formed over the first substrate. The semiconductor structure further includes a solder stud formed over the metal pad, and the solder stud has a flat top surface parallel to a top surface of the first substrate.

In some embodiments, a method for forming a semiconductor structure is provided. The method for forming a semiconductor structure includes forming a metal pad over a first substrate and forming a resist layer having an opening over the first substrate. The opening is positioned over the metal pad. The method for forming a semiconductor structure further includes filling the opening with a solder material and removing the resist layer to form a solder stud having a straight sidewall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first structure comprising:
   a first substrate having a top surface;
   a metal pad formed over the first substrate;
   a solder stud formed over the metal pad, wherein the solder stud includes a straight sidewall and is made of tin and has a height in a range from about 5 μm to about 20 μm;
   a second structure comprising:
   a second substrate;
   a conductive post formed over the second substrate; and
   a non-conductive paste filled in gaps between the first substrate and the second substrate,
   wherein the solder stud and the conductive post are directly bonded together, and the solder stud does not extend onto a sidewall of the conductive post, and wherein the non-conductive paste is in direct contact with the straight sidewall of the solder stud, and
   wherein the solder stud is not reflowed.

2. The semiconductor structure as claimed in claim 1, wherein the straight sidewall is in a first direction and the first substrate is in a second direction, and an angle between the first direction and the second direction is in a range from about 45° to about 90°.

3. The semiconductor structure as claimed in claim 1, wherein the straight sidewall is in a first direction and the first substrate is in a second direction, and an angle between the first direction and the second direction is in a range from about 45° to about 85°.

4. The semiconductor structure as claimed in claim 1, wherein the solder stud has a flat top surface.

5. The semiconductor structure as claimed in claim 1, wherein the solder stud is in a shape of a trapezoid.

6. The semiconductor structure as claimed in claim 1, wherein the conductive post is heat-press-bonded to a top surface of the solder stud.

7. The semiconductor structure as claimed in claim 1, further comprising:
   a seed layer positioned between the metal pad and the solder stud.

8. The semiconductor structure as claimed in claim 1, wherein a width of a bottom surface of the solder stud is greater than a width of a top surface of the solder stud.

9. A semiconductor structure, comprising:
a first structure comprising:
a first substrate;
a metal pad formed over the first substrate;
a solder stud formed over the metal pad, wherein the solder stud includes a straight sidewall; and
a second structure comprising:
a second substrate;
a conductive post formed over the second substrate;
wherein the solder stud and the conductive post are directly bonded together, and the solder stud does not extend onto a sidewall of the conductive post and the solder stud is made of tin.

10. The semiconductor structure as claimed in claim 9, wherein the solder stud has a height in a range from about 5 μm to about 20 μm.

11. The semiconductor structure as claimed in claim 9, wherein the solder stud is in a shape of a rectangle.

12. The semiconductor structure as claimed in claim 9, further comprising:
a first metal layer formed over the metal pad; and
a second metal layer formed over the first metal layer.

13. The semiconductor structure as claimed in claim 12, wherein a sum of a thickness of the first metal layer and a thickness of the second metal layer is less than a height of the solder stud.

14. The semiconductor structure as claimed in claim 9, wherein the solder stud is not reflowed.

15. The semiconductor structure as claimed in claim 13, wherein the solder stud is in direct contact with the second metal layer.

16. The semiconductor structure as claimed in claim 13, wherein the conductive post is a copper pillar.

17. A semiconductor structure, comprising:
a first substrate having a top surface;
a metal pad formed over the first substrate;
a solder stud formed over the metal pad, wherein the solder stud has a straight sidewall and is made of tin;
a second substrate;
a conductive post supported by the second substrate and directly bonded to the top surface of the solder stud; and
a non-conductive paste filled in gaps between the first substrate and the second substrate,
wherein the solder stud is not reflowed, and the straight sidewall of the solder stud is directly covered by the non-conductive paste.

18. The semiconductor structure as claimed in claim 17, wherein the solder stud is in a shape of a trapezoid.

19. The semiconductor structure as claimed in claim 17, wherein the conductive post is heat-press-bonded to the flat top surface of the solder stud.

20. The semiconductor structure as claimed in claim 17, further comprising:
a seed layer positioned between the metal pad and the solder stud.

* * * * *